United States Patent
Leuschner et al.

(10) Patent No.: US 7,259,025 B2
(45) Date of Patent: Aug. 21, 2007

(54) FERROMAGNETIC LINER FOR CONDUCTIVE LINES OF MAGNETIC MEMORY CELLS

(75) Inventors: Rainer Leuschner, Corbeil Essones (FR); Michael C. Gaidis, Wappingers Falls, NY (US); Judith M. Rubino, Ossining, NY (US); Lubomyr Taras Romankiw, Briarcliff Manor, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/644,792

(22) Filed: Dec. 22, 2006

(65) Prior Publication Data

US 2007/0105241 A1    May 10, 2007

Related U.S. Application Data

(62) Division of application No. 10/903,356, filed on Jul. 30, 2004, now abandoned.

(51) Int. Cl.
*H01L 21/00*    (2006.01)
(52) U.S. Cl. .................. 438/3; 438/622; 438/641; 438/642; 438/678; 257/E21.208
(58) Field of Classification Search ............ 438/3, 438/95, 98, 622, 625–627, 641, 674, 677, 438/678, 642, 653; 257/E21.208, 295; 365/65–66
See application file for complete search history.

(56) References Cited

U.S. PATENT DOCUMENTS

| 5,956,267 | A | 9/1999 | Hurst et al. |
| 6,413,788 | B1 | 7/2002 | Tuttle |
| 6,707,083 | B1 | 3/2004 | Hiner et al. |
| 6,885,074 | B2 | 4/2005 | Durlam et al. |
| 7,005,691 | B2 | 2/2006 | Odagawa et al. |
| 7,026,677 | B2 | 4/2006 | Kamijima et al. |

(Continued)

FOREIGN PATENT DOCUMENTS

| WO | WO 01/71777 A2 | 9/2001 |
| WO | WO 03/077258 A2 | 9/2003 |

OTHER PUBLICATIONS

Durlam, M., et al., "A low power 1Mbit MRAM based on 1T1MTJ bit cell integrated with Copper Interconnects," 2002 Symposium on VLSI Circuits Digest of Technical Papers, 2002, pp. 158-161, IEEE, Los Alamitos, CA.

(Continued)

*Primary Examiner*—Thanhha S. Pham
(74) *Attorney, Agent, or Firm*—Slater & Matsil, L.L.P.

(57) ABSTRACT

A method of forming a ferromagnetic liner on conductive lines of magnetic memory devices and a structure thereof. The ferromagnetic liner increases the flux concentration of current run through the conductive lines, reducing the amount of write current needed to switch magnetic memory cells. The conductive lines are formed in a plate-up method, and the ferromagnetic liner is selectively formed on the plated conductive lines. The ferromagnetic liner may also be formed over conductive lines and a top portion of vias in a peripheral region of the workpiece.

26 Claims, 6 Drawing Sheets

U.S. PATENT DOCUMENTS

| | | |
|---|---|---|
| 7,072,677 B2 | 7/2006 | Kim et al. |
| 2003/0137028 A1 | 7/2003 | Hosotani et al. |
| 2003/0137053 A1 | 7/2003 | Okayama |
| 2003/0199104 A1* | 10/2003 | Leuschner et al. ............. 438/3 |
| 2004/0032010 A1 | 2/2004 | Kools et al. |
| 2004/0043562 A1 | 3/2004 | Sharma et al. |
| 2004/0259274 A1* | 12/2004 | Park et al. .................... 438/3 |

OTHER PUBLICATIONS

Lenssen, K.-M.H., et al. "Magnetic Random Access Memory (MRAM) and its Prospects," 2001 Non-volatile Memory Technology Symposium Proceedings, 2001, 6pp.

Reohr, W., et al. "Memories of Tomorrow," IEEE Circuits & Devices Magazine, Sep. 2002, pp. 17-27, IEEE, Los Alamitos, CA.

* cited by examiner

FERROMAGNETIC LINER FOR CONDUCTIVE LINES OF MAGNETIC MEMORY CELLS

This application is a divisional of patent application Ser. No. 10/903,356, entitled "Ferromagnetic Liner for Conductive Lines of Magnetic Memory Cells," filed on Jul. 30, 2004, now abandoned which application is incorporated herein by reference.

CROSS-REFERENCE TO RELATED APPLICATIONS

This application relates to the following co-pending and commonly assigned patent application: Ser. No. 10/249,528, filed on Apr. 17, 2003, entitled, "Magnetically Lined Conductors," which application is hereby incorporated herein by reference.

TECHNICAL FIELD

The present invention relates generally to the fabrication of semiconductor devices, and more particularly to the fabrication of magnetic memory devices.

BACKGROUND

Semiconductors are used in integrated circuits for electronic applications, including radios, televisions, cell phones, and personal computing devices, as examples. One type of semiconductor device is a semiconductor storage device, such as a dynamic random access memory (DRAM) or flash memory, which use electric charge to store information.

A recent development in semiconductor memory devices involves spin electronics, which combines semiconductor technology and magnetics. The spin of electrons, rather than the charge, is used to indicate the presence of binary states "1" and "0." One such spin electronic device is a magnetic random access memory (MRAM) device, which includes conductive lines (wordlines and bitlines) and a magnetic stack or magnetic tunnel junction (MTJ), which functions as a magnetic memory cell. A sufficient current flowing through the conductive lines can generate enough magnetic field to orient the polarity of the magnetic films in the magnetic memory cell into a certain direction. Digital information, represented as a "0" or "1," is storable in the alignment of magnetic moments in the magnetic memory cell films. The resistance of the magnetic memory cell depends on the magnetic moment alignment, and is used as an indicator the binary state of the device.

MRAM devices are typically arranged in an array of rows and columns, and the wordlines and bitlines are activated to access each individual memory cell. In a cross-point cell (XPC) MRAM array, current is run through the particular wordlines and bitlines to select a particular magnetic memory cell. In a field effect transistor (FET) array cell, each MTJ is disposed proximate to a FET, and the FET for each MTJ is used to select a particular magnetic memory cell in the array. In a FET array, an electrode is typically formed between the MTJ and the FET to make electrical contact between the MTJ and the FET.

An advantage of MRAM devices compared to traditional semiconductor memory devices such as (DRAM) devices is that MRAM devices are non-volatile. For example, a personal computer (PC) utilizing MRAM devices would not have a long "boot-up" time as with conventional PCs that utilize DRAM devices. Also, an MRAM device does not need to be continually powered to "remember" the stored data. Therefore, it is expected that MRAM devices will replace flash memory, DRAM and static random access memory devices (SRAM) devices in electronic applications where a low-power, high performance memory device is needed.

Because MRAM devices operate differently than traditional memory devices and because they are relatively new, they introduce design and manufacturing challenges.

SUMMARY OF THE INVENTION

Embodiments of the present invention achieve technical advantages by providing novel methods of forming conductive lines and forming a ferromagnetic liner around the conductive lines of an MRAM device.

In accordance with a preferred embodiment of the present invention, a method of fabricating a conductive line of a magnetic memory device includes providing a workpiece having at least one magnetic memory cell formed thereon, encapsulating the at least one magnetic memory cell within a first insulating layer, the at least one magnetic memory cell comprising an electrical contact disposed thereon, and exposing the electrical contact of the magnetic memory cell at a top surface of the first insulating layer. A plating seed layer is formed upon the first insulating layer and the electrical contact over the at least one magnetic memory cell, a mask is formed over the plating seed layer, leaving an unmasked region above the at least one magnetic memory cell, and a first conductive line is plated in the unmasked regions, including over the at least one magnetic memory cell. The mask is removed, exposing portions of the plating seed layer, the portions of the plating seed layer exposed by removing the mask are removed, and a ferromagnetic liner is formed over at least the first conductive line.

In accordance with another preferred embodiment of the present invention, a magnetic memory device includes a plurality of magnetic memory elements formed in an array region and a plurality of conductive vias formed in a peripheral region. A first conductive line is disposed over at least one of the plurality of magnetic memory elements, the first conductive line comprising a top surface and sidewalls. A second conductive line is disposed over at least one of the plurality of conductive vias, the second conductive line comprising a top surface and sidewalls. A ferromagnetic liner is disposed on the top surface and the sidewalls of the first conductive line, and on the top surface and sidewalls of the second conductive line. The ferromagnetic liner is also disposed on a top portion of the sidewalls of a conductive via proximate the second conductive line.

Advantages of embodiments of the present invention include providing methods of forming conductive lines and forming ferromagnetic liners around the conductive lines of MRAM devices. Because ferromagnetic liners serve to focus the magnetic field of the conductive wires upon the memory elements, the same magnitude of field for switching the polarity of the memory element can be generated with a smaller current than for conductive wires without ferromagnetic liners. The write current and power consumption of an MRAM device can be reduced in accordance with embodiments of the present invention that describe how to create the ferromagnetic liners. Because the conductive lines are plated rather than formed by damascene processes, the conductive lines are free-standing and the ferromagnetic liner can be more easily formed on the top surface and sidewalls thereof into the desired upside-down horseshoe shape.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an MRAM device. Embodiments of the present invention may also be applied, however, to other magnetic devices, namely, magnetic memory devices, for example. Embodiments of the invention are also useful in other semiconductor applications where it is desirable to alter the path of the magnetic field generated by conductive wires.

Figure 1:
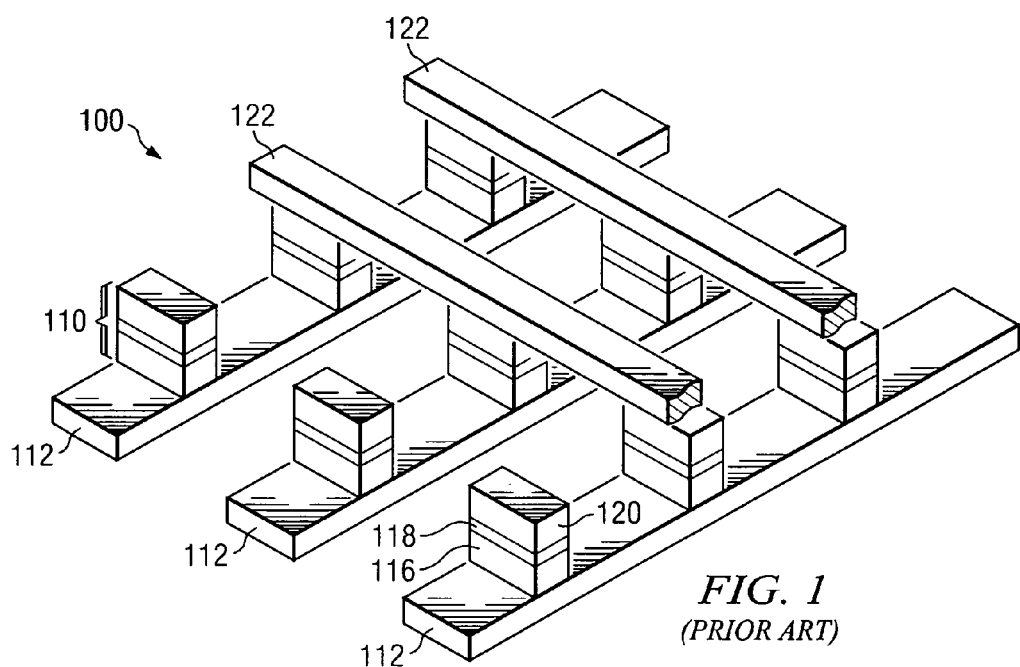
FIG. 1 illustrates a perspective view of a prior art MRAM XPC array.

FIG. 1 illustrates a perspective view of a prior art cross-point MRAM array 100 having bitlines 122 located substantially perpendicular to wordlines 112 in adjacent metallization layers. Magnetic stacks 110 are positioned between the bitlines 122 and wordlines 112 adjacent and electrically coupled to bitlines 122 and wordlines 112. The magnetic stacks 110 are also referred to herein as magnetic memory elements, magnetic memory cells, or MTJ's.

A typical manufacturing process for the MRAM array 100 of FIG. 1 will next be described. A workpiece (not shown) is provided, typically comprising silicon oxide over single-crystal silicon, for example. The workpiece may include other conductive layers or other semiconductor elements, e.g., transistors, diodes, etc. Compound semiconductors such as GaAs, InP, Si/Ge, and SiC may be used in place of silicon, for example.

A first inter-level dielectric layer (not shown) is deposited over the workpiece. The inter-level dielectric may comprise an insulating material such as silicon dioxide, for example. The inter-level dielectric layer is patterned, for example, for vias, and etched. The vias may be filled with a metal such as copper, tungsten or other metals, for example.

A metallization layer, e.g., an M1 layer comprising aluminum, copper, or other conductive material, is formed next. If copper is used for the first conductive lines 112, typically a damascene process is used to form the first conductive lines 112. A dielectric, not shown, is deposited over inter-level dielectric layer and vias. The dielectric layer is patterned and etched, and the trenches are filled with conductive material to form the first conductive lines 112 in the M1 layer. Alternatively, the first conductive lines 112 may be formed using a subtractive etch process, and a dielectric material may be disposed between the first conductive lines 112.

Next, a magnetic stack 110 is formed over first conductive lines 112. The magnetic stack 110 typically comprises a first magnetic layer 116 including one or more magnetic layers. The first magnetic layer 116 may comprise a plurality of layers of materials such as PtMn, NiMn, IrMn, FeMn, CoFe, Ru, Al, Ta, TaN, and NiFe, as examples, although alternatively, other materials may be used for the first magnetic layer 116, for example. The first magnetic layer 116 is also referred to as a hard layer, a pinned layer, or a fixed layer because its magnetic orientation is fixed. In some situations, it is advantageous to place the pinned layer in the location of second magnetic layer 120, but for the purposes of this discussion, 116 is referred to as the pinned layer herein.

The magnetic stack 110 also includes a thin dielectric tunnel barrier layer 118 comprising an insulator or semiconductor, e.g., $Al_2O_3$, deposited over the first magnetic layer 116, although alternatively, the dielectric layer 118 may comprise other insulating or semiconducting materials. The dielectric layer 118 is often referred to as a tunnel layer or barrier layer.

The magnetic stack 110 also includes a second magnetic layer 120 comprising similar materials as the first magnetic layer 116. The second magnetic layer 116 is often referred to as the soft layer or free layer because its magnetic orientation is changed depending on the desired logic state of the magnetic memory cell.

The first magnetic layer 116, dielectric layer 118 and second magnetic layer 120 are patterned to form a plurality of MTJ's 110, with each MTJ 110 being disposed over a first conductive line 112. The patterned magnetic stacks or MTJ's 110 are typically substantially oval in shape, as shown, or alternatively may be other shapes, such as circular, rectangular, or asymmetrically-shaped, as examples. The MTJ's 110 comprise magnetic memory elements. The terms "MTJ," "magnetic memory element," and "magnetic memory cell" are used interchangeably herein.

A plurality of second conductive lines 122 is formed over the MTJ's 110. The second conductive lines 122 may be formed within an M2 layer, for example, and are typically positioned in a different direction than the first conductive lines 112. If the second conductive lines 122 comprise copper, again, a damascene process is typically used to form them. A dielectric layer (not shown) is deposited over the MTJ's 110. The dielectric layer is patterned and etched with trenches that will be filled with a conductive material to form the second conductive lines 122. Alternatively, a non-damascene process may be used to form the first and second conductive lines 112 and 122. Conductive lines 112 and 122 may function as the wordlines and bitlines, respectively, of the MRAM array 100, as examples.

The order of the magnetic stack 110 layers may be reversed, e.g., the pinned layer 116 may be on the top of or above the insulating layer 118, and the free layer 120 may be on the bottom of or below the insulating layer 118. Similarly, the wordlines 112 and bitlines 122 may be disposed either above or below the magnetic stack layers 110.

In MRAM devices, information is stored in the free layer 120 of the MTJ's 110. To store the information, the magnetization of one ferromagnetic layer or information layer, e.g., the free layer 120 is aligned either parallel or anti-parallel to a second magnetic layer or reference layer, e.g., the pinned layer 116. The information is detectable due to the fact that the resistance of a parallel element is different than an anti-parallel element. Switching from a parallel to an anti-parallel state, and vice versa, may be accomplished by running current, often referred to as the switching current or write current, through one or both conductive lines 112 and 122, and from the pinned layer 116 to the free layer 120, or vice versa. The switching current induces a magnetic field at the location of the MTJ memory element 110 large enough to change the magnetization of the information layer or free layer 120. A relatively small tunneling current is run through the element 110 to read the resistive state.

A problem with MRAM devices relates to the amount of current needed in the conductive lines 122 and 112 to switch the magnetic polarity of the MTJ element 110. Relatively large currents may be needed to induce enough magnetic flux, and this implies a relatively large power needed to operate the memory array. Significant benefits can be realized if the operating power can be reduced. Therefore, what is needed in the art is a method of focusing or concentrating the magnetic flux of conductive "write" lines onto the magnetic memory elements so that they may switch state at lower operating power.

Embodiments of the present invention derive technical advantages by providing a novel method of forming free-standing conductive lines, and forming a ferromagnetic material liner around the conductive lines (e.g., bitlines or wordlines) disposed over a magnetic memory cell. The ferromagnetic liner functions as a barrier layer against material diffusion, and also a magnetic flux concentrator.

FIGS. 2-5, 6A, 6B, 7-9, 10A and 10B show cross-sectional views of a method of forming a ferromagnetic liner over the top surface and sidewalls of conductive lines of a magnetic memory device in accordance with a preferred embodiment of the present invention. Like numerals are used for the various elements in FIGS. 2-5, 6A, 6B, 7-9, 10A and 10B as were described with reference to FIG. 1. To avoid repetition, each reference number shown in the diagram may not necessarily be described again in detail herein. Rather, similar materials x10, x12, etc. are preferably used for the material layers shown as were described for FIG. 1, where x=1 in FIG. 1 and x=2 in FIG. 2. Only one MTJ 210 is shown in each figure; however, there may be a plurality of MTJ's 210 and conductive lines formed on a single device 201.

The embodiments shown in FIGS. 2-5, 6A, 6B, 7-9, 10A and 10B illustrate a method of manufacturing a FET MRAM device. However, embodiments of the invention also have useful application in crosspoint MRAM devices such as the one shown in FIG. 1.

First, an overview of an embodiment of the invention will be described with reference to FIG. 10A. In the cross-sectional view shown in FIG. 10A, first conductive lines 212a, 212b, and 212c are formed over a workpiece 202 and are separated by an insulating layer 204a. An MTJ 210 is formed over the first conductive line 212a. A conductive cap layer or electrical contact 206 may be formed over the MTJ 210, as shown. The MTJ 210 may be one of a plurality of MTJ's 210 formed in an MRAM array, such as the one shown in FIG. 1, for example. The MTJ 210 is isolated electrically from other MTJ's (not shown) by insulating layers 204b and 204c.

A second conductive line 240a comprising a conductive material is formed over the MTJ 210 by plating. A second conductive line 240b may also be formed in a peripheral region of the workpiece 202 over a conductive via 230. A ferromagnetic liner 250 is formed over the second conductive line 240a and also over the second conductive line 240b, as shown.

Because the second conductive lines 240a and 240b are formed using a plating technique, they are free-standing and may be selectively coated with the ferromagnetic liner 250 using a plating bath, to be described further herein. A process to remove barrier or plating seed materials 232 or 234 between adjacent MTJ's 210 is tuned to result in the rounding of the top corners of the conductive lines 240a and 240b, which results in the rounding of the shape of the ferromagnetic liner 250, enabling better focusing of the magnetic flux generated by currents in conductive lines 240a and 240b. The ferromagnetic liner 250 forms the shape of an upside-down letter U in the cross-section of the device 201 around the second conductive lines 240a and 240b, for example. A barrier layer 232 may be disposed below the conductive lines 240a and 240b, and a seed layer 234 may be disposed between the barrier layer 232 and the conductive lines 240a and 240b, to be described further herein.

The second conductive lines 240a and 240b may be covered with an encapsulating insulating layer 204c. The insulating layer 204c comprises a dielectric material and may be patterned in subsequent manufacturing steps to make electrical contact to the second conductive line 240a and 240b, for example (not shown).

Figure 2:
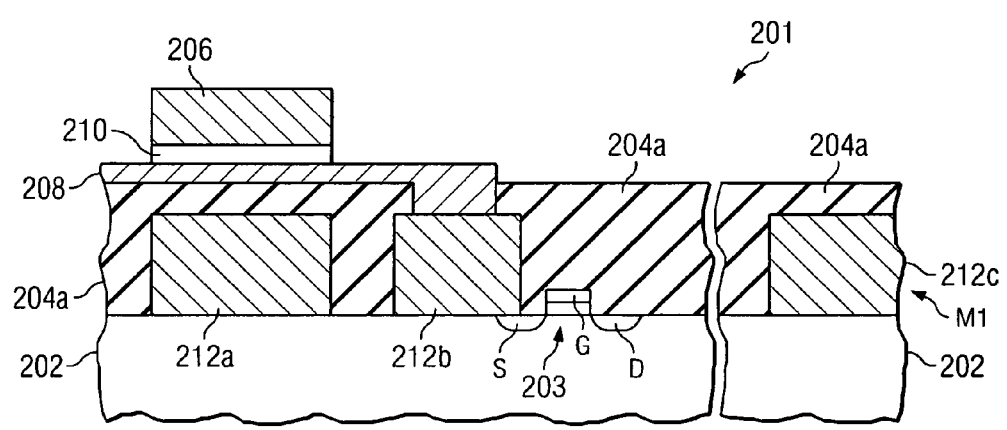
FIGS. 2-5, 6A, 6B, 7-9, 10A and 10B show cross-sectional views of a method of forming a ferromagnetic liner over the top surface and sidewalls of conductive lines of a FET-cell magnetic memory device in accordance with a preferred embodiment of the present invention.

Referring to FIG. 2, a manufacturing process for an MRAM device 201 in accordance with a preferred embodiment of the present invention will next be described. First, a workpiece 202 comprising a semiconductor substrate is provided. The workpiece 202 may include a plurality of FETs 203 formed therein, as shown, for example, in a FET MRAM array. A plurality of first conductive lines 212a, 212b and 212c are formed over the workpiece 202, as shown. The first conductive lines 212a and 212b may be formed proximate an MTJ 210 in a first metallization layer M1, wherein the first conductive lines 212a and 212b are adapted to function as wordlines or bitlines of the MRAM device 201, for example. The first conductive lines 212a, 212b, and 212c preferably comprise Cu, Ag, Al, or combinations thereof, as examples, although other conductive materials may alternatively be used. The first conductive lines 212a, 212b, and 212c preferably comprise a thickness of about 450 nm or less, although alternatively, the first conductive lines 212a, 212b, and 212c may comprise other dimensions. The first conductive lines 212c may be formed in a peripheral region of the MRAM device 201, e.g., in a region that supplies power or other support circuitry for the device 201, as examples. The first conductive line 212c in the peripheral region may be used to make electrical connection to the workpiece 202 or to other layers of the device 201, to be described further herein.

An insulating layer 204a is disposed between the first conductive lines 212a, 212b and 212c, as shown. The insulating layer 204a may comprise a dielectric material such as $SiO_2$ or low-k materials, as examples. A conductive strap 208 may be disposed between one of the conductive lines 212b and the MTJ 210, as shown, to make electrical contact between the conductive line 212b and the MTJ 210. One first conductive line 212a in the array region proximate the MTJ 210 may be a write wordline, and another first conductive line 212b proximate the MTJ 210 may be a read wordline, as examples.

A cap layer 206 comprising a conductive material may be disposed over the MTJ 210. The cap layer 206 may comprise a hard mask that was used to pattern one or more layers of the MTJ 210, for example. In a preferred embodiment, the cap layer 206 preferably comprises a thickness of about 200 nm or less, although alternatively, the cap layer 206 may comprise other dimensions. The cap layer 206 preferably comprises a conductive material such as TiN, Ti, Ta, TaN, WN, W, Cu, or combinations thereof, as examples, although the cap layer 206 may alternatively comprise other materials. The cap layer 206 may be increased in thickness in accordance with an embodiment of the invention to provide a larger process window for removing a seed layer 234 and barrier layer 232 for second conductive lines 240a and 240b (not shown in FIG. 2; see FIG. 7), to be described further herein. The cap layer 206 may function as a top electrical contact for the MTJ 210, for example.

Figure 3:
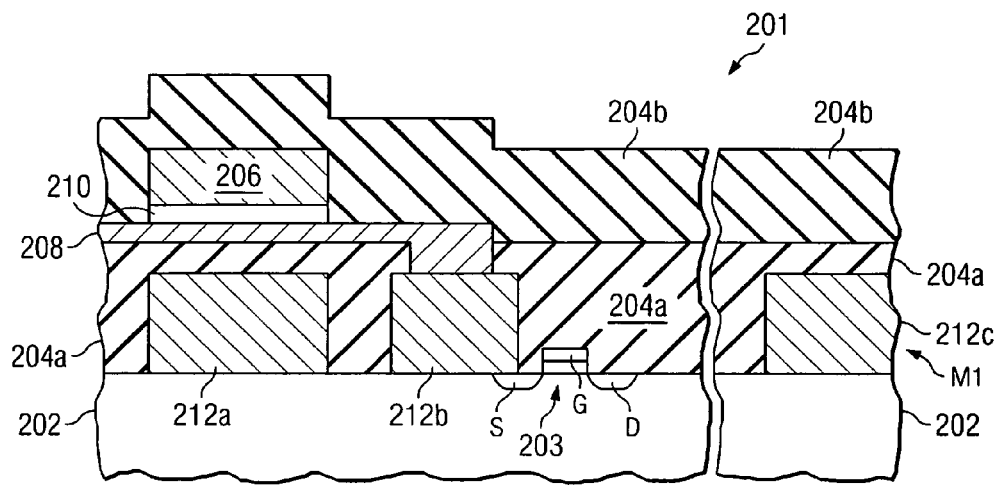
Figure 4:
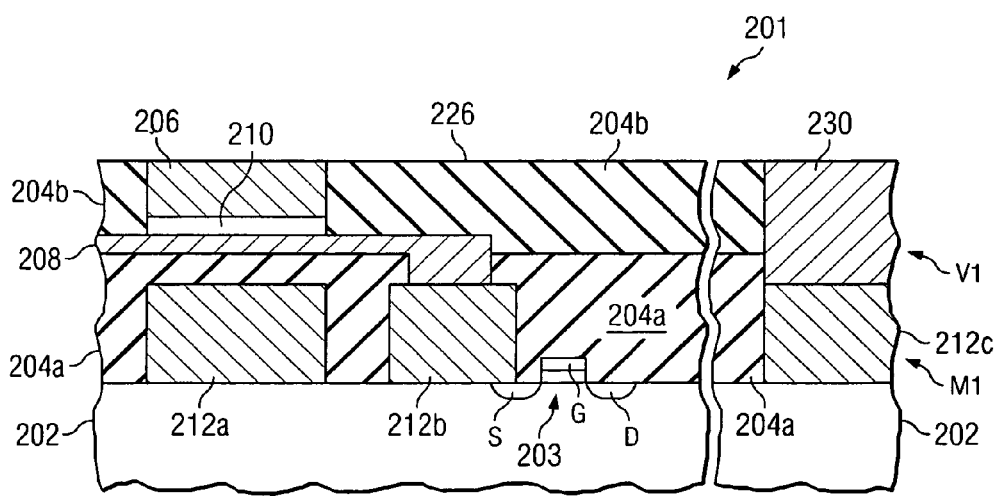

Next, a conductive via 230 (see FIG. 4) is formed over and abutting the first conductive line 212c in the peripheral region of the device 201. The conductive via 230 is preferably formed using a single Damascene process. To form the via 230, an insulating layer 204b is deposited over the cap layer 206 and insulating layer 204a, as shown in FIG. 3. The insulating layer 204b preferably comprises $SiO_2$, low-k materials, or other insulating materials, as examples. The insulating film 204b is then planarized at a height which either exposes the top of the conductive cap 206, or covers the cap 206 by a small enough amount that the cap 206 is exposed by the Damascene polish used to pattern via 230. Typical post-planarization height of dielectric film 204b will be between about 50 nm below the top surface of cap 206 and about 10 nm above the top surface of cap 206, although other heights can be accommodated by varying subsequent processes, and an alternative embodiment utilizing thicker dielectric 204b is explained below. Planarization of the dielectric film 204b can be accomplished by chemical-mechanical planarization or polish (CMP), etchback techniques, through the use of self-planarizing spin-on dielectrics, or combinations of these techniques. The insulating layer 204b may comprise a self-planarizing spin-on dielectric such as SiLK™ available from DuPont, and materials based on methyl silsesquioxane and hydrogen silsesquioxane or other spin-on dielectric materials, as examples.

In the first embodiment, after planarization of the insulating layer 204b to close proximity with the top surface of cap 206, the insulating layer 204b is etched with a via 230 pattern, and a conductive material is deposited over the patterned insulating layer 204b to fill the via, forming conductive via 230. Excess portions of the conductive material residing over the insulating layer 204b are removed, e.g., using an etch or CMP process, leaving the structure shown in FIG. 4 having a substantially planar top surface 226, and the conductive top surfaces of both cap 206 and via 230 are exposed for the next process step.

In an alternative embodiment, preferably the insulating material 204b is deposited substantially thicker than shown in FIG. 3, so that the lowest level of the upper surface of 204b is preferably more than about 100 nm above the conductive cap 206. Before the insulating layer 204b is etched with the via 230 pattern, the insulating material 204b is planarized using a CMP process that leaves preferably more than about 25 nm of insulating material 204b above the conductive cap 206. At this point, the via 230 pattern is etched into dielectric layer 204b, the via is filled with conductive material, and is polished in standard damascene fashion. The top surface of the dielectric layer 204b is substantially coplanar with the top surface of via 230, and both surfaces are preferably more than about 10 nm above the top surface of cap 206. To prepare for the deposition of the next conductive wiring layer, the top surface of cap layer 206 must be exposed. To accomplish this, the planar top surface of dielectric 204b is then etched with a wet chemical or reactive ion etch (RIE) process so that the cap layer 206 is exposed. This may be accomplished with a timed etch, or for better process control may use an endpoint signal generated from byproducts of the cap layer 206 that are exposed to the etch. This alternative embodiment is advantageous in that CMP stresses as seen by the MTJ 210 are greatly reduced through the use of an encapsulating dielectric that completely covers MTJ 210 and cap layer 206 during any CMP processes.

Figure 5:
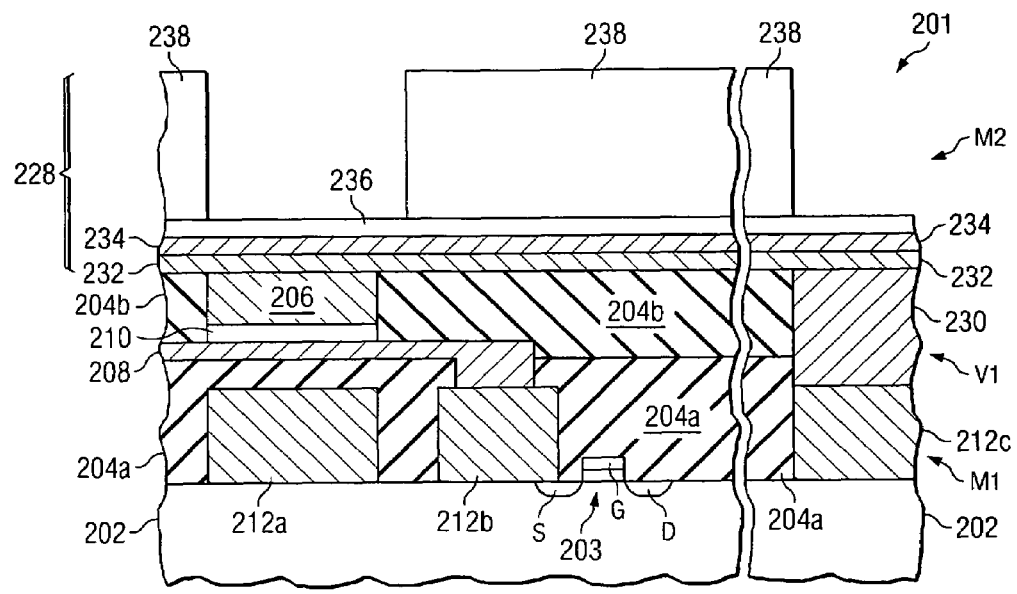

Next, second conductive lines 240a and 240b (FIG. 6A) are formed in a plate-up process. Referring to FIG. 5, before the conductive wiring material (which may comprise Cu, or other conductive materials) is deposited, a barrier material 232 comprised of about 20 nm or less of Ta, TaN, WN, TiN, Ru, multiple layers thereof, or combinations thereof, as examples, may be deposited over the patterned insulating layer 204b to prevent migration of the conductive wiring material. The barrier layer 232 may alternatively comprise other materials and dimensions. Preferably, the barrier layer 232 thickness is as small as can effectively be used for inhibition of seed layer 234 or conductive material 240 diffusion, as thinner barrier layers 232 will be easier to remove in subsequent process steps. For example, an effective barrier layer 232 can be deposited with atomic layer deposition (ALD) in thicknesses of approximately 5 nm. In one embodiment, the barrier layer 232 comprises a first layer of TaN deposited over the cap layer 206, insulating layer 204b, and conductive via 230, and a second layer of Ta deposited over the TaN first layer. The barrier layer 232 prevents diffusion of the seed layer 234 and conductive material 240 (FIG. 6A) into adjacent material layers, such as 206 and 204b.

To promote satisfactory plating of conductive material 240 (FIG. 6A), a seed layer 234 is deposited over the barrier layer 232, as shown. The seed layer 234 preferably comprises about 50 nm or less of a conductive material, such as Ru, Cu, Ag, or combinations thereof, as examples, although the seed layer 234 may alternatively comprise other materials and dimensions. The seed layer 234 may be chosen such that it also can function as a barrier layer, in which case layers 232 and 234 are one and the same. Preferably, the seed layer 234 comprises a thickness of about 20 nm or less, so that removing the seed layer 234 is easier in a later manufacturing step. Combining the barrier and seed functions into one material can allow for thinner barrier/seed layers, and will make for easier subsequent processing steps. This can be realized, e.g., with the use of a Ru barrier/seed layer. In one embodiment, the seed layer 234 comprises the same material as the conductive material of the second conductive lines 240a and 240b, as an example. The seed layer 234 is also referred to herein as a plating seed layer 234.

An optional anti-reflective coating (ARC) 236 may be deposited over the seed layer 234, as shown in FIG. 5. The ARC 236 may comprise about 60 nm of an organic material, a photoresist that includes a dye, or other ARC materials, as examples. The ARC 236 prevents reflections from the seed layer 234 surface from impacting the lithographic patterning of mask 238. A masking material 238 is deposited over the ARC 236, as shown in FIG. 5. The masking material 238 preferably comprises about 400 nm of a photoresist or an insulating material such as an oxide or nitride, as examples, although alternatively, other insulating materials and dimensions may be used. For example, the masking material 238 may comprise $SiO_x$, SiN, SiCOH, SiCN, fluorinated $SiO_x$, or low dielectric constant (low-k) materials such as polyarylene (PAE) e.g., available from Schumacher, or an aromatic hydrocarbon such as SiLK™, available from DuPont, although other low-k or insulating materials may also be used.

The masking material 238 is patterned using a lithography technique with the pattern for second conductive lines 240a and 240b, wherein the second conductive lines 240a will function as the bitlines (or wordlines, depending on the MRAM device 201 design) of the device 201. The ARC 236 is opened or removed from the patterned area, using an etch process such as a RIE using $H_2$ plasma, as an example, although other etch processes may alternatively be used.

Figure 6A:
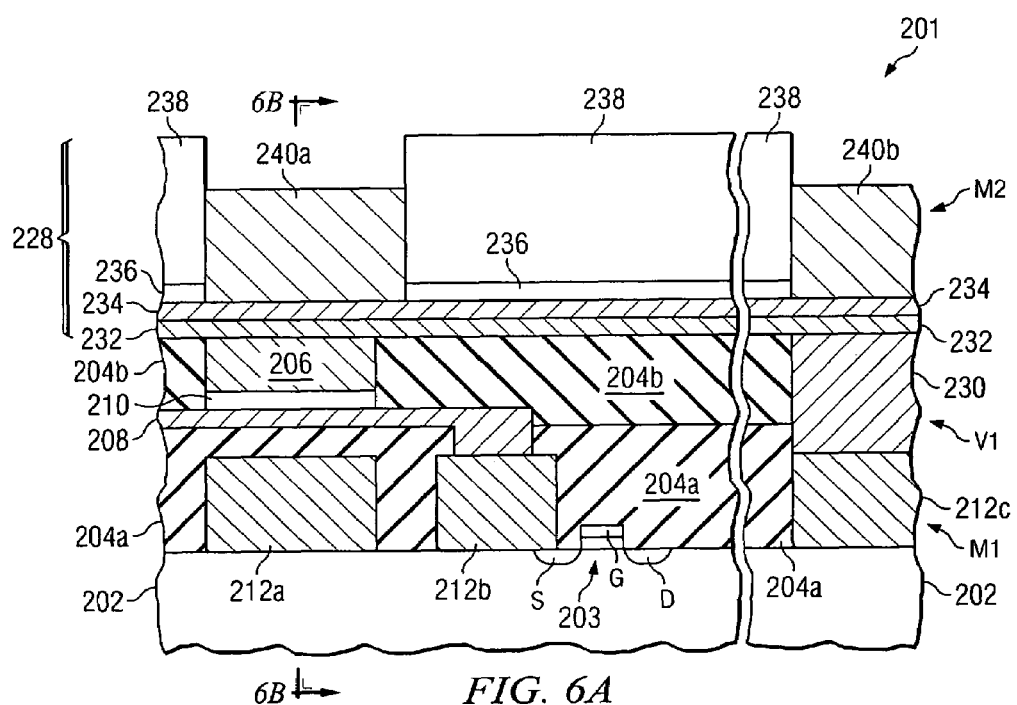
Figure 6B:
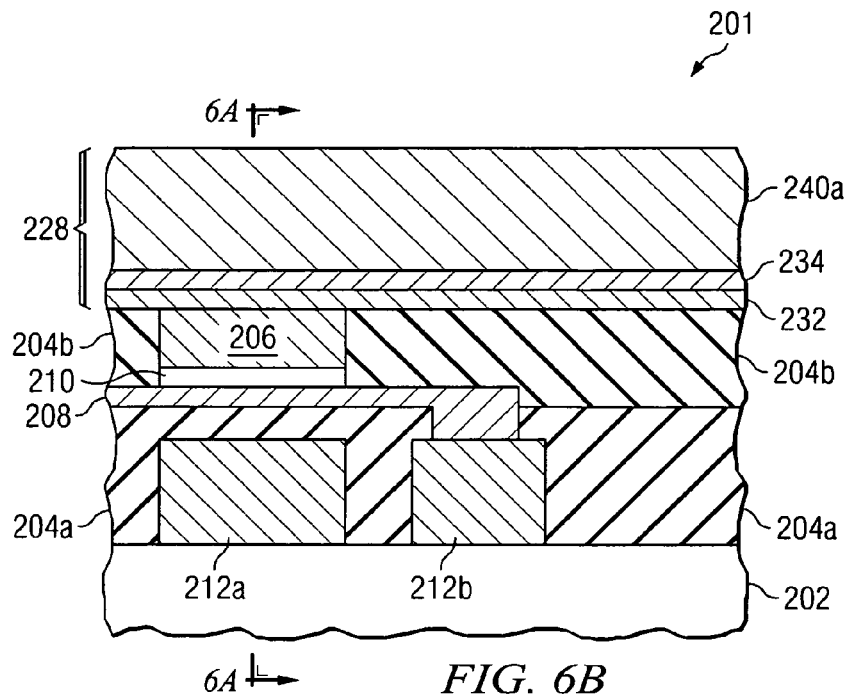

Second conductive lines 240a and 240b are formed preferably using an electrochemical plating (ECP) process, as shown in FIG. 6A. For example, the workpiece 202 may be placed in a plating bath, and the conductive material 240a and 240b is plated onto the exposed seed layer 234. The conductive material 240a and 240b is not plated onto the masking material 238; the conductive material 240a and 240b is selectively plated onto the seed layer 234. If the seed layer 234 comprises copper, for example, preferably copper is plated onto the seed layer 234 to form the conductive lines 240a and 240b.

Various plating techniques may be used to form the second conductive lines 240a and 240b. In one embodiment, the plating process is electroless and/or preferably a potentiostatically triggered electroless process, to minimize or avoid potential bridging of electroless deposit between second conductive lines 240a and 240b due to Pd residue that can result from the standard Pd activation process used in electroless plating. If an electroless plating process is used, the magnetic film plating bath may be neutral (e.g., having a pH of about 6 to 8), or alkaline (e.g., having a pH of about 8 to 14), as examples. Such electroless plating processes advantageously enable the use of a thinner, e.g., about 20 nm or less, seed layer 234, for example.

In another embodiment, electroplating may be used to form the second conductive lines 240a and 240b, although the seed layer 234 should be thicker, e.g., about 50 nm in this embodiment, to enhance uniformity of the plating. Alternatively, a potentiostatic plating process can be used, for example. In one embodiment, the plating bath is preferably acidic.

Combinations of the plating processes described herein, and other plating processes, may be also used to form the conductive lines 240a and 240b, for example.

The selectively plated conductive lines 240a and 240b preferably comprise a thickness less than the thickness of the mask material, about 450 nm or less, of a conductive material such as Cu, Ag, Al, or combinations thereof, as examples, although alternatively, the conductive lines 240a and 240b may comprise other materials and dimensions.

Figure 9:
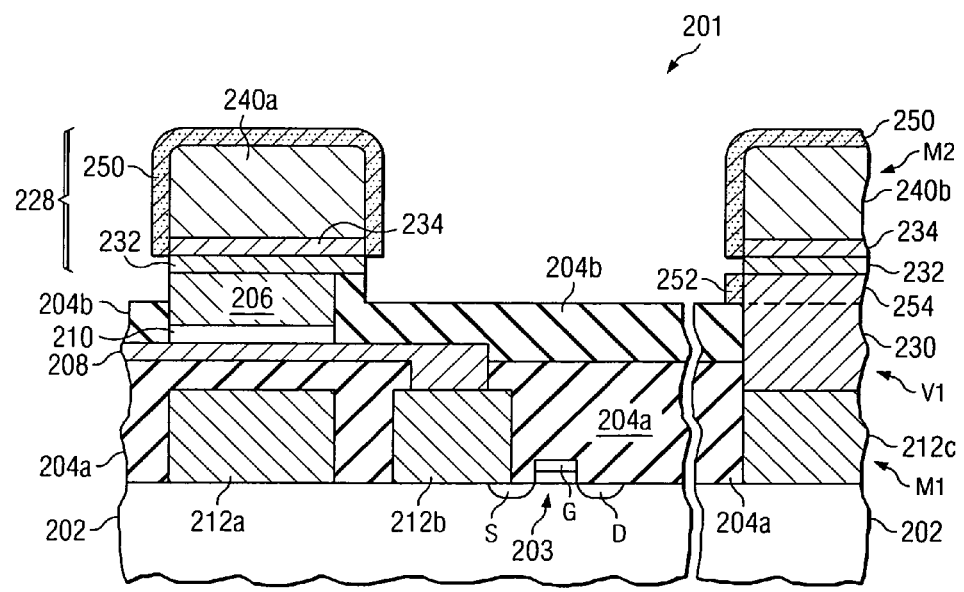
Figure 10A:
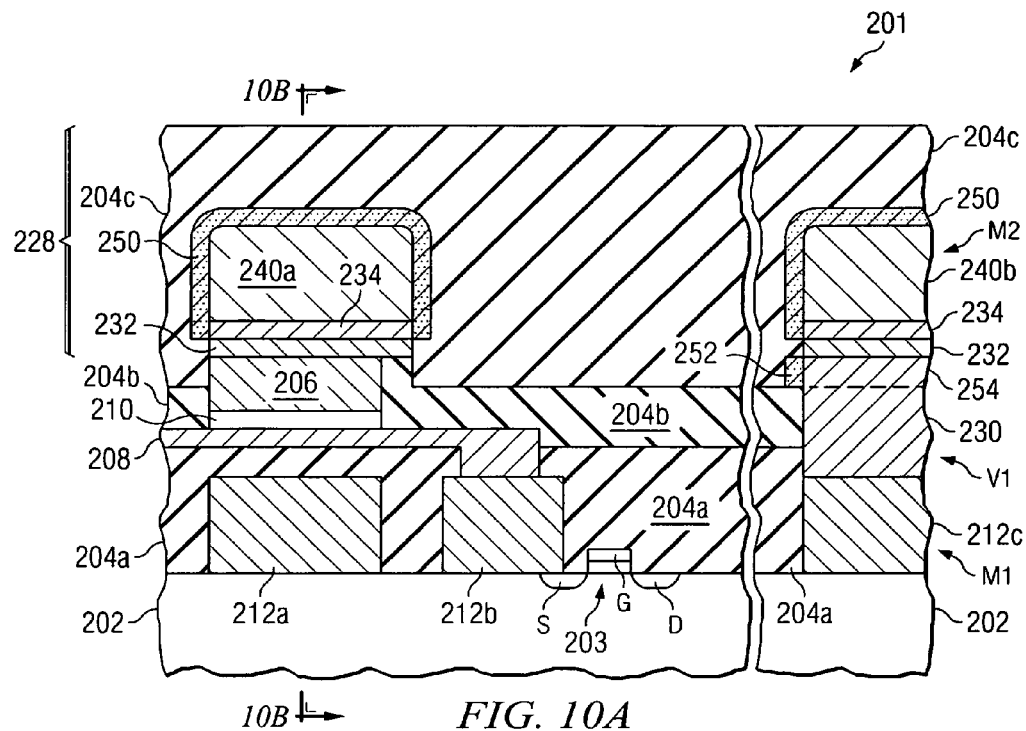
Figure 10B:
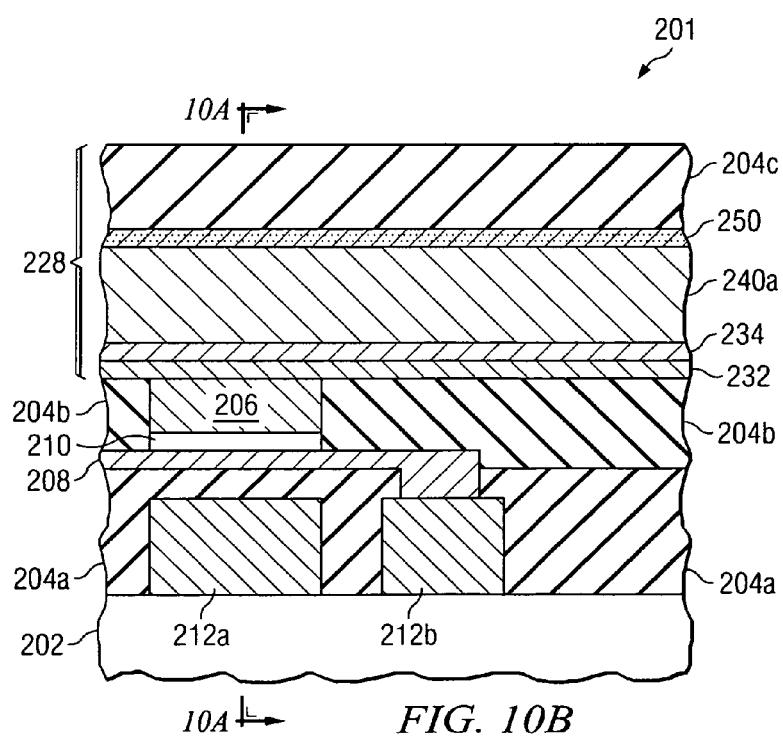

Note that in FIGS. 5, 6A, 7, 8, 9, and 10A, the material layers in region 228 above the cap layer 206, and the material layers 212 in FIGS. 2 through 10B are shown in cross-section for clarity. As the preferred design of MRAM circuitry would typically call for wires 240a to be orthogonal to or positioned in a different direction than wires 212a, the simplified figures may not correspond exactly to physical MRAM product designs. Although some designs may call for wires 240a and 212a to be oriented as shown in FIG. 10A, the representations shown in FIGS. 6B and 10B are more realistic (but less illuminating). The FIGS. 6B and 10B show conductive lines 240a without the 90 degree rotation of region 228 in the other figures, illustrating that the second conductive line 240a, seed layer 234 and barrier layer 232 may be positioned at approximately a 90 degree angle to the first conductive lines 212a, proximate the MTJ 210. The exact orientation of these conductive lines is not of impact to the present invention, and the processes disclosed herein are suitable for arbitrarily oriented conductive lines.

Figure 7:
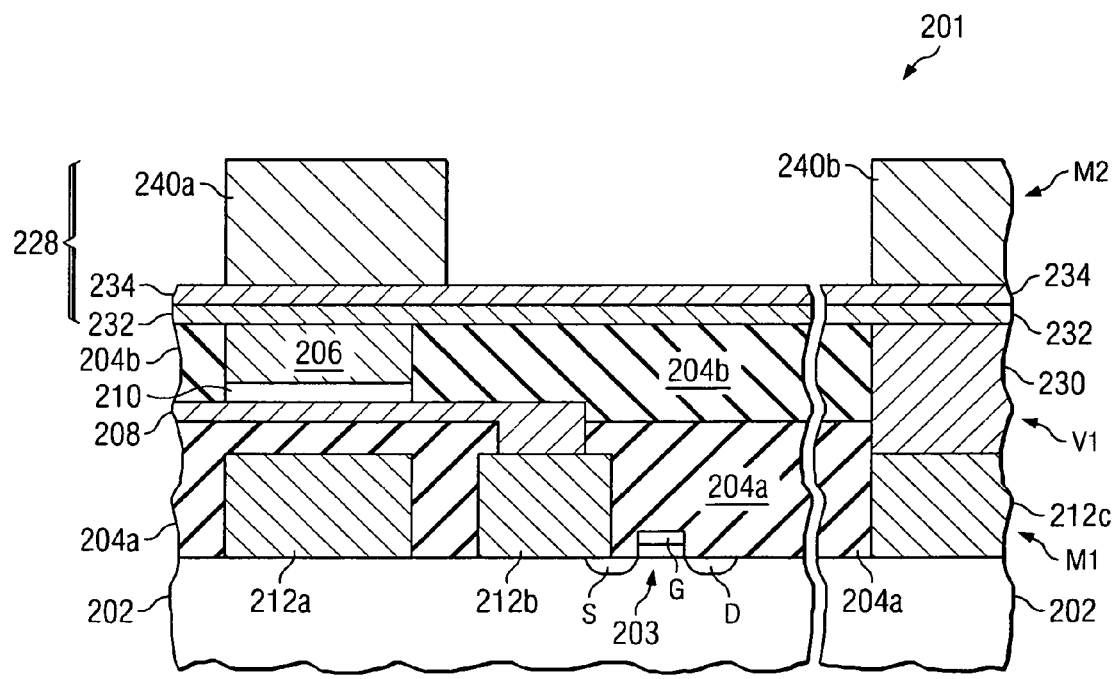
Figure 8:
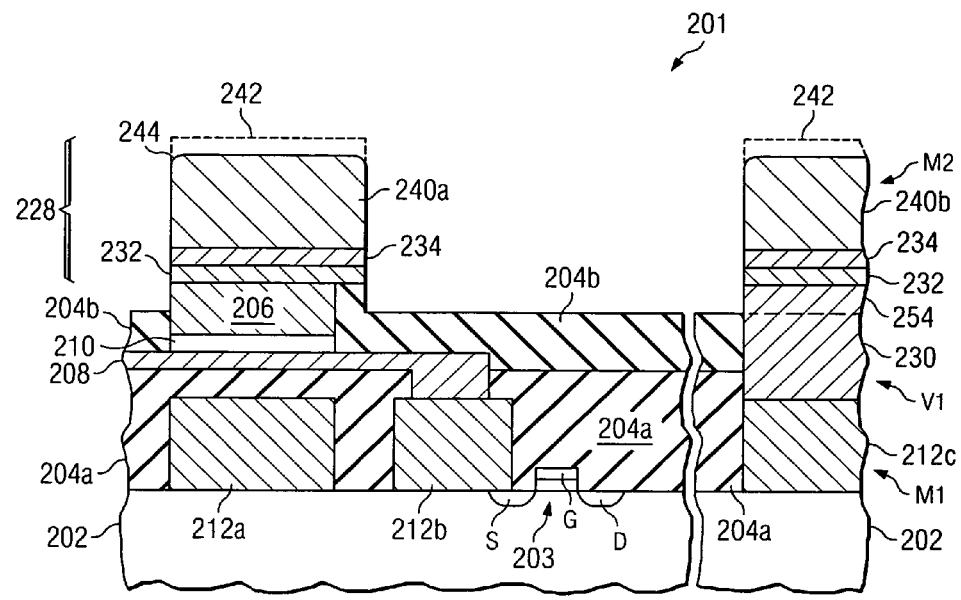

Continuing with a preferred embodiment of the processing scheme, the masking material 238 and ARC 236 is removed after plating, as shown in FIG. 7. For example, if the masking material 238 comprises resist, the resist may be removed using a wet strip process or an oxygen plasma. If the masking material 238 comprises an insulating material, an etch process selective against etching of the metal layers 240 and 234 may be used to remove the masking material 238 and the ARC 236, for example.

The seed layer 234 is removed, using a RIE (e.g., $CO/NH_3$), and the barrier layer 232 is also removed, also using a RIE (e.g., $Ar/CF_4$). Alternatively, other wet chemical or dry etch processes, including physical sputtering or ion milling, as examples, may be used to remove the ARC 236, seed layer 234, and barrier layer 232 from between the conductive lines 240a and 240b, for example, leaving the structure shown in FIG. 8.

A top portion of the insulating layer 204b may be eroded when removing the barrier layer 232 and/or the seed layer 234 and ARC 236, as shown. About 10 nm or more of the insulating layer 204b may be removed, for example, leaving a top portion of the cap layer 206 and/or the conductive via 230 exposed, in one embodiment. The workpiece 202 may be exposed to an optional cleaning step, e.g., using $H_2$ plasma or other cleaning processes, for example.

Note that advantageously, the RIE processes or other etch processes used to remove the barrier layer 232, and/or seed layer 234 and ARC 236 may be tuned to erode a top portion 242 and the corners 244 (e.g., where sidewalls and the top surface meet) of the second conductive lines 240a and 240b. In particular, in a preferred embodiment, the etch process to remove the seed layer 234 will remove material at the corners 244 of the second conductive lines 240a and 240b, because the conductive lines 240 are not be immune to the chemical or physical components chosen to remove the ARC 236, seed 234, or barrier 232 layers. This is beneficial because a conductive line having curved edges or corners 244 results in a ferromagnetic liner also having curved edges, and a curved structure functions better to focus the magnetic flux generated by current run through the conductive lines 240.

A ferromagnetic liner 250 is then formed on the sidewalls, top surface and curved corners of the second conductive lines 240a and 240b, as shown in FIG. 9. Through choice of deposition methods such as electroless plating, potentiostatically triggered electroless plating, or potentiostatic plating, as examples, the ferromagnetic liner 250 can be selectively formed on conductive material surfaces including all exposed edges of conductive lines 240a and 240b and the sidewalls of seed layer 234. The ferromagnetic liner 250 may also form on the exposed sidewall portions of the conductive via 230, as shown at 252. Preferably, the ferromagnetic liner 250 is not formed over the insulating layer 204b, barrier layer 232 or cap layer 206 over the MTJ 210.

The ferromagnetic liner 250 preferably comprises a magnetic material. The ferromagnetic liner 250 preferably comprises Ni, Fe, Co, alloys thereof, P, B, or combinations thereof, as examples, although alternatively, the ferromagnetic liner 250 may comprise other materials. In one embodiment, the ferromagnetic liner 250 comprises CoWP, which is advantageous because a diffusion barrier between the second conductive line 240a and 240b material and the ferromagnetic liner 250 is not required, for example. If the conductive line 240a and 240b material comprises Cu, for example, CoWB or CoWCu may be used for the ferromagnetic liner 250 material, if the coercitivity is small, for example. The ferromagnetic liner 250 preferably comprises a thickness of about 50 nm or less, for example, although alternatively, the ferromagnetic liner 250 may comprise other dimensions. The ferromagnetic liner 250 preferably comprises CoWP, CoWB, CoWCu, NiFe, NiFeP, NiFeB, CoNi, CoNiP, CoNiB, CoNiFe, CoNiFeP, or CoNiFeB in a preferred embodiment of the present invention, with coercivity and permeability the main factors in determining what material and deposition techniques are to be used. The coercivity and permeability are tuned to be suitable for best operation of the electronics and magnetics in the MRAM circuitry.

The ferromagnetic liner 250 is preferably selectively plated onto the second conductive lines 240a and 240b. For example, the ferromagnetic liner 250 may be plated using a standard electroless plating process using Pd activation, a potentiostatically triggered electroless process, a potentiostatic electroplating process, a galvanostatic plating process, or combinations thereof, as examples, although alternatively, other methods may be used to form the ferromagnetic liner 250. Alternatively, with suitable wiring layout to allow current flow to necessary wiring, electroplating may be used to form the ferromagnetic liner 250 around only certain desired portions of wiring 240.

In one embodiment, an electroless plating process using Pd activation is used to form the ferromagnetic liner 250, the workpiece 202 is dipped in a Pd solution. Pd exchanges with the surface atoms of the second conductive lines 240a and 240b: e.g., if the second conductive lines 240a and 240b comprise Cu, a few surface atoms of the second conductive lines 240a and 240b exchange with the Pd, which is more noble than Cu, for example. The Cu atoms dissolve into the Pd solution. The Pd functions as a catalyst for the electroless plating process to form the ferromagnetic liner 250 on the second conductive lines 240a and 240b. Some Pd may be adsorbed into the top surface of the insulating layer 204b in this embodiment; therefore, the workpiece 202 is preferably rinsed after being dipped in the Pd solution, e.g., with a water rinse, to remove any undesired Pd from the top surface of the insulating layer 204b, so that the ferromagnetic liner 250 will not be formed over the insulating layer 204b, which would short the second conductive lines 240a and 240b. In another embodiment, the plating process is preferably catalyzed using current, using potentiostatic triggering, (in which electrons initiate the electroless reaction), which is advantageous because there is no chance that Pd will be left remaining on the top surface of the insulating layer 204b, preventing bridging or shorting of the conductive lines 204a and 204b, for example.

If electroplating, potentiostatic, galvanostatic, or potentiostatically triggered electroless processes are used to form the ferromagnetic liner 250, in these embodiments, the second conductive lines 240a (and other second conductive lines disposed over MTJ's 210 in the array, not shown) need to be shorted together for the plating process. This either requires an additional lithography step, to deposit and pattern the shorting material, or alternatively, the ARC 236 and seed layer 234 can be patterned after the ferromagnetic liner 250 is electroplated onto the second conductive lines 240a. The seed layer 234 can function as the shorting material (providing a short path for the electroplating process), and the ARC 236 protects the seed layer 234 from being plated with the ferromagnetic liner 250, for example. However, in this embodiment, the ferromagnetic liner 250 is preferably plated thicker than actually required, because a portion of the ferromagnetic liner 250 could be consumed during the seed layer 234 etch. Alternatively, the ferromagnetic liner 250 may be selectively formed in the desired thickness, and it can either be protected by an additional photoresist or oxide while the seed layer 234 is etched away from over the insulating layer 204b.

If electroplating is used, in one embodiment, no short line to the peripheral conductive line 240b may be formed, so that the peripheral conductive line 240b does not get plated with the ferromagnetic liner 250 (not shown). This can be advantageous because later when contact is made to the via 230, there is no magnetic material (e.g., ferromagnetic liner 250) present that could contaminate tools.

Note that the ferromagnetic liner 250 is substantially conformal to the shape of the underlying second conductive lines 240a and 240b; therefore, the ferromagnetic liner 250 includes a curve where the second conductive line 240a and 240b top surface meets the sidewall, as shown.

The ferromagnetic liner 250 may be deposited using other deposition techniques, e.g., a selective chemical vapor deposition (CVD) process or other selective deposition methods, or combinations thereof with the above mentioned plating process. A diffusion barrier (not shown) may be formed or deposited over the second conductive lines 240a and 240b using before forming the ferromagnetic liner 250, for example. The diffusion barrier preferably comprises a material that prevents diffusion of the second conductive line 240a and 240b material into adjacent material layers yet allows the selective formation of the ferromagnetic liner 250 over the second conductive lines 240a and 240b using a plating process. For example, the diffusion barrier may comprise CoWP, CoWB, or other Co alloys, as examples, deposited in a thickness of about 30 nm or less, although alternatively, the diffusion barrier may comprise other materials and dimensions. A diffusion barrier may also be deposited after the ferromagnetic liner 250, if there is concern that the ferromagnetic liner material may migrate during subsequent processing and device operation.

An insulating layer 204c is deposited over the ferromagnetic liner 250, exposed portions of the insulating layer 204b, and exposed edge portions of the barrier layer 232, as shown in FIG. 10A. FIG. 10B shows region 228 with a 90-degree rotation, as a more realistic embodiment.

The manufacturing processing of the device 201 is continued with the deposition of encapsulating insulating layer 204c. For example, the ferromagnetic liner 250 may be encapsulated with a non-conductive diffusion barrier such as a Si:C:H based CVD material or other dielectric material.

Other conductive structures such as vias may be formed in the insulating layers 204c, 204b and 204a. At the site of the vias 230, e.g., second conductive line 240b, flux concentration is not necessary, but the magnetic materials of the ferromagnetic liner 250 does not deleteriously impact the electrical performance of the vias, and can help to prevent void formation by inhibiting material diffusion near the vias.

The cap layer 206 provides an increased process window for the novel method of forming conductive lines 240a and 240b and ferromagnetic liner 250 in accordance with embodiments of the present invention. For example, the cap layer 206 advantageously protects the MTJ 210 during the formation of the conductive lines 240a and 240b and ferromagnetic liner 250. The MTJ 210 is not exposed to the plating or etch processes described herein.

Advantages of embodiments of the invention include providing methods of increasing the flux concentration of second conductive lines 240a of a magnetic memory device 201 by forming free-standing conductive lines 240a, and forming a ferromagnetic liner 250 on the sidewalls, top surfaces and curved corner edges of the second conductive lines 240a. Because the magnetic flux is concentrated, the write current for magnetic memory cell or MTJ 210 may be decreased in accordance with embodiments of the present invention, decreasing the power consumption for the memory device 201, for example. Alternatively, for the same amount of current in wire 240a, the better flux concentration with liner 250 will allow use of MTJ devices 210 with higher switching field thresholds. This can improve operating margins, error immunity, and lifetime of the circuit.

Embodiments of the present application are advantageous when implemented in any magnetic memory device, including NRAM device 201, for example. Embodiments of the invention may be implemented in cross-point MRAM arrays, FET MRAM arrays, and hard disk drive read and write heads, for example. Embodiments of the present invention may also have useful application in other semiconductor device applications where concentration of magnetic flux of a conductive line is required, for instance in the tuning of wire inductance.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a conductive line of a magnetic memory device, the method comprising:
   providing a workpiece having at least one magnetic memory cell formed thereon;
   encapsulating the at least one magnetic memory cell within a first insulating layer, the at least one magnetic memory cell comprising an electrical contact disposed thereon;
   exposing the electrical contact of the at least one magnetic memory cell at a top surface of the first insulating layer;
   forming a plating seed layer upon the first insulating layer and the electrical contact over the at least one magnetic memory cell;
   forming a mask over the plating seed layer, leaving an unmasked region above the at least one magnetic memory cell;
   plating a first conductive line in the unmasked region, including over the at least one magnetic memory cell;
   removing the mask, exposing portions of the plating seed layer;
   removing the portions of the plating seed layer exposed by removing the mask; and
   forming a ferromagnetic liner over at least the first conductive line.

2. The method according to claim 1, wherein forming the ferromagnetic liner over the first conductive line comprises forming the ferromagnetic liner using an electroless plating process, an electroless plating process using Pd activation, a potentiostatically triggered electroless process, a potentiostatic electroplating process, a galvanostatic plating process, an electroplating process, a selective chemical vapor deposition (CVD) process, or combinations thereof.

3. The method according to claim 1, wherein forming the plating seed layer comprises forming about 50 nm or less of Ru, Cu, or Ag, or combinations thereof.

4. The method according to claim 3, wherein removing the plating seed layer comprises a reactive ion etch (RIE) or ion milling.

5. The method according to claim 4, wherein plating the first conductive line comprises forming a first conductive line comprising a top surface and sidewalls, wherein corners are disposed where the top surface meets the sidewalls, wherein removing the plating seed layer comprises removing a portion of the corners of the first conductive line, forming rounded corners on the first conductive line.

6. The method according to claim 1, further comprising forming a barrier layer over the at least one magnetic memory cell, before forming the plating seed layer, and further comprising removing the barrier layer from over the first insulating layer, before forming the ferromagnetic liner.

7. The method according to claim 6, wherein forming the barrier layer comprises forming about 20 nm or less of Ta, TaN, WN, TiN, Ru, or combinations thereof.

8. The method according to claim 1, wherein forming the ferromagnetic liner comprises forming about 50 nm or less of Ni, Fe, Co, alloys thereof, P, B, or combinations thereof.

9. The method according to claim 8, wherein forming the ferromagnetic liner comprises forming CoWP, CoWB, CoWCu, NiFe, NiFeP, NiFeB, CoNi, CoNip, CoNiB, CoNiFe, CoNiFeP, or CoNiFeB.

10. The method according to claim 1, further comprising forming an anti-reflective coating (ARC) over the plating seed layer, before forming the mask, and further comprising removing the ARC from over the first insulating layer, before forming the ferromagnetic liner.

11. The method according to claim 1, wherein plating the first conductive line comprises forming a first conductive line comprising Cu, Ag, or Al, or combinations thereof, and wherein plating the first conductive line comprises forming a first conductive line comprising a thickness of about 450 nm or less.

12. The method according to claim 1, wherein plating the first conductive line comprises plating the first conductive line using an electroless plating process, a potentiostatically triggered electroless plating process, a potentiostatically triggered electroless plating process using Pd activation, an electroplating process, a potentiostatic plating process, or combinations thereof.

13. The method according to claim 1, wherein exposing the electrical contact of the at least one magnetic memory cell comprises a chemical-mechanical polish (CMP) of the first insulating layer.

14. The method according to claim 1, wherein exposing the electrical contact of the at least one magnetic memory cell comprises a combination of a chemical mechanical polish (CMP) process to planarize the first insulating layer followed by a reactive ion etch (RIE) or wet chemical etch to expose the electrical contact of the at least one magnetic memory cell.

15. The method according to claim 1, wherein the first insulating layer used to encapsulate the at least one magnetic memory cell comprises a self-planarizing material, and wherein exposing the electrical contact of the at least one magnetic memory cell is achieved by a reactive ion etch (RIE) or a wet chemical etch of a portion of the self-planarizing material.

16. The method according to claim 1, further comprising:
planarizing the first insulating layer; and
using a single damascene process, forming a via in the first insulating layer after planarizing the first insulating layer, filling the via in the first insulating layer with a conductive material, and polishing the first insulating layer and the conductive material to form a conductive via within the first insulating layer; wherein plating the first conductive line further comprises plating a first conductive line over the conductive via, and wherein forming the ferromagnetic liner further comprises forming the ferromagnetic liner over the first conductive line over the conductive via.

17. The method according to claim 16, wherein the conductive via comprises sidewalls, further comprising removing a top portion of the first insulating layer, before forming the ferromagnetic liner, and wherein forming the ferromagnetic liner further comprises forming the ferromagnetic liner over a top portion of the sidewalls of the conductive via.

18. The method according to claim 1, further comprising:
planarizing the first insulating layer; and
using a single damascene process, forming a via in the first insulating layer after planarizing the first insulating layer, filling the via in the first insulating layer with a conductive material, and polishing the first insulating layer and the conductive material to form a conductive via within the first insulating layer; wherein plating the first conductive line further comprises plating a first conductive line over the conductive via, and wherein forming the ferromagnetic liner does not comprise forming the ferromagnetic liner over the first conductive line over the conductive via.

19. The method according to claim 1, wherein forming the mask comprises forming a resist or forming a dielectric material comprising $SiO_x$, SiN, SiCOH, SiCN, fluorinated $SiO_x$, or a low dielectric constant (low-k) material.

20. The method according to claim 1, wherein the magnetic memory device comprises a magnetic random access memory (MRAM) device, wherein the at least one magnetic memory cell comprises a plurality of magnetic tunnel junctions (MTJ's) arranged in an array of rows and columns, wherein plating the first conductive line comprises forming a first conductive line over each of the MTJ's in a row or column of the array.

21. The method according to claim 1, further comprising planarizing the at least one magnetic memory cell and the first insulating layer, before forming the mask over the first insulating layer.

22. The method according to claim 21, further comprising depositing a second insulating layer over the at least one magnetic memory cell and the first insulating layer, wherein planarizing the at least one magnetic memory cell and the first insulating layer further comprises planarizing the second insulating layer.

23. The method according to claim 1, wherein the electrical contact disposed over the at least one magnetic memory cell comprises about 200 nm or less of TiN, Ti, Ta, TaN, WN, W, Cu, or combinations thereof.

24. The method according to claim 1, further comprising forming a diffusion barrier over the first conductive line, before forming the ferromagnetic liner.

25. The method according to claim 24, wherein forming the diffusion barrier comprises forming about 30 nm or less of a Co alloy.

26. The method according to claim 24, wherein forming the diffusion barrier comprises forming CoWP or CoWB.

* * * * *